United States Patent
Herrmann et al.

(10) Patent No.: US 7,672,420 B2
(45) Date of Patent: Mar. 2, 2010

(54) SHIFTER REGISTER FOR LOW POWER CONSUMPTION APPLICATION

(75) Inventors: Frederick P. Herrmann, Sharon, MA (US); Kun Zhang, Austin, TX (US)

(73) Assignee: Kopin Corporation, Taunton, MA (US)

( * ) Notice: Subject to any disclaimer, the term of this patent is extended or adjusted under 35 U.S.C. 154(b) by 0 days.

(21) Appl. No.: 12/420,476

(22) Filed: Apr. 8, 2009

(65) Prior Publication Data

US 2009/0202033 A1 Aug. 13, 2009

Related U.S. Application Data (63) Continuation of application No. 11/985,347, filed on Nov. 14, 2007, now Pat. No. 7,522,694.

(60) Provisional application No. 60/860,059, filed on Nov. 20, 2006.

(51) Int. Cl.
 *G11C 19/00* (2006.01)
(52) U.S. Cl. .............................. 377/64; 377/70; 377/73
(58) Field of Classification Search .................. 377/64, 377/68–70, 73, 74
 See application file for complete search history.

(56) References Cited

U.S. PATENT DOCUMENTS

| | | | |
|---|---|---|---|
| 5,479,370 A | 12/1995 | Furuyama et al. |
| 5,859,630 A | 1/1999 | Huq |
| 5,869,857 A | 2/1999 | Chen |
| 5,949,398 A | 9/1999 | Kim |
| 6,232,939 B1 | 5/2001 | Saito et al. |
| 6,934,210 B2 | 8/2005 | Akiba et al. |
| 2004/0234020 A1 | 11/2004 | Yu |
| 2007/0071158 A1 | 3/2007 | Wei et al. |
| 2007/0297559 A1 | 12/2007 | Cho et al. |

OTHER PUBLICATIONS

Mailed Dec. 22, 2008, Notice of Allowance and Fee(s) Due, U.S. Appl. No. 11/985,347.

*Primary Examiner*—Tuan Lam
(74) *Attorney, Agent, or Firm*—Hamilton, Brook, Smith & Reynolds, P.C.

(57) ABSTRACT

A high voltage shift register stage which directly accepts low voltage clock signal inputs without using clock buffers. In particular, a shift register stage circuit is adapted to operate with a low voltage swing clock signal, with the stage circuit having a single state node, a, driven directly. This arrangement allows for reduced power consumption and higher operating speeds.

12 Claims, 6 Drawing Sheets

SHIFTER REGISTER FOR LOW POWER CONSUMPTION APPLICATION

RELATED APPLICATION(S)

This application is a continuation of U.S. application Ser. No. 11/985,347, filed Nov. 14, 2007 now U.S. Pat. No. 7,522,694, which claims the benefit of U.S. Provisional Application No. 60/860,059, filed on Nov. 20, 2006. The entire teachings of the above application(s) are incorporated herein by reference.

BACKGROUND OF THE INVENTION

The present invention relates to shift register circuits, and more particularly to shift register designs adapted for providing the lowest possible power consumption.

Figure 1:
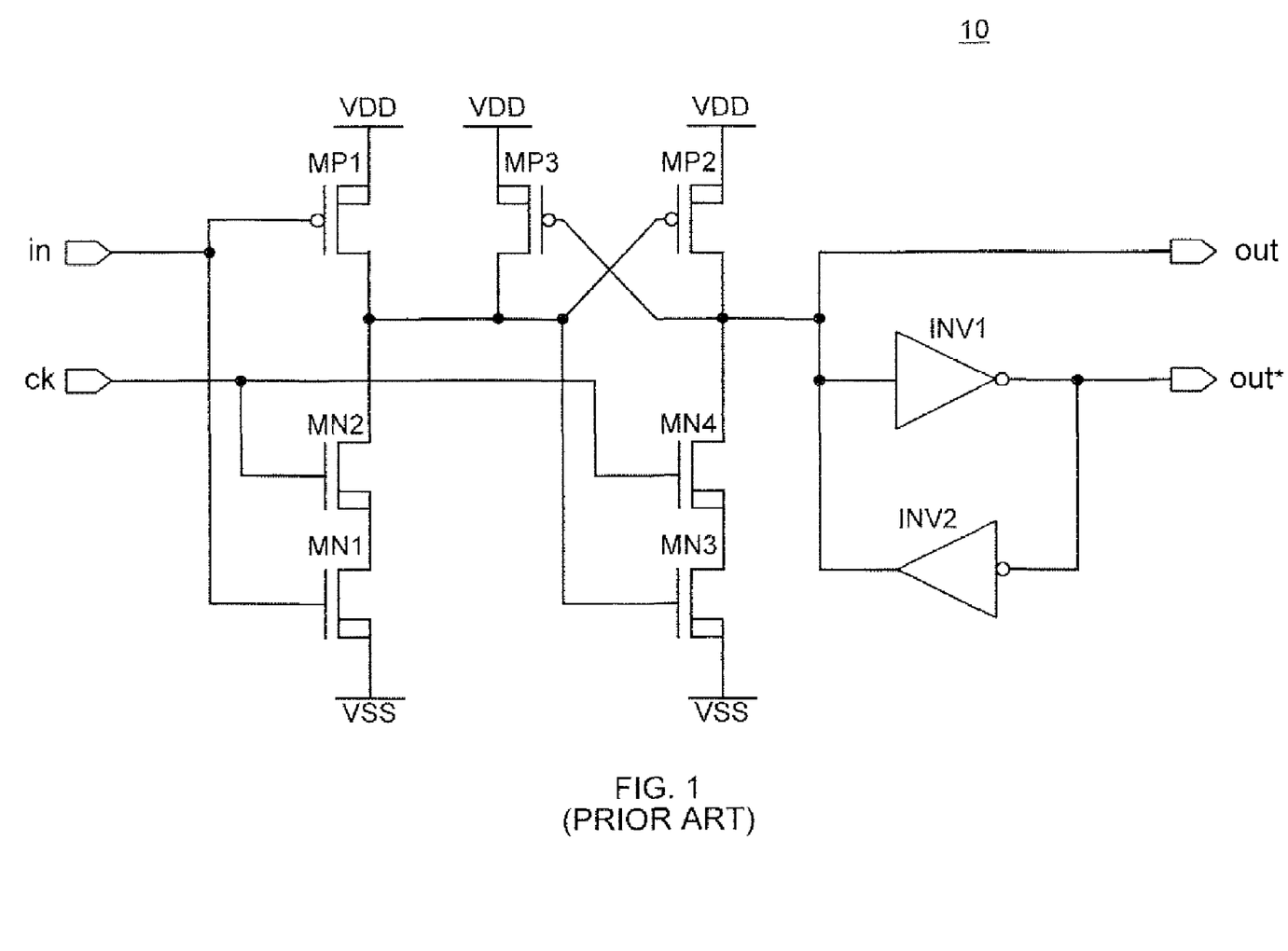
FIG. 1 illustrates a prior art shift register stage that accommodates low voltage swing clock signal inputs.

FIG. 1 illustrates one conventional design for a single stage static shift register. As with any shift register, this circuit 10 has a signal input in, a clock input ck and in this configuration complimentary outputs out and out*. The circuit is powered by a supply voltage provided by two rail voltages VDD and VSS.

This specific circuit uses an input signal buffer transistor MP1 that feeds a pair of cross-coupled transistors MP2 and MP3 to store the input signal state. Inverters INV1 and INV2 connected to the output of MP1 serve to buffer output voltage and current levels. Clock switch transistors MN1, MN2, MN3 and MN4 turn on the shift register to accept a digital input signal, such as from a previous stage.

The switches MN1-MN4 must be fully turned on or off for the shift register to function, thus requiring a full rail-to-rail voltage swing on their gate terminals. Even if external low voltage clock signals are applied, level shifters and clock buffers (not shown in FIG. 1) must be used to bring the gate control voltages to full rail voltage swing. Unfortunately, the power consumption in these clock buffers is equal to $V^2 C_p f_c$, where V is the power supply voltage difference (VDD-VSS), $C_p$ is the total parasitic capacitance connected to the clock buffer outputs, and $f_c$ is clock frequency. With a high voltage supply (10v or more), a large number of shift registers in series, long connection wires, and high clock frequency, a shift register using the stage circuit of FIG. 1 can therefore consume a significant amount of power.

Figure 2:
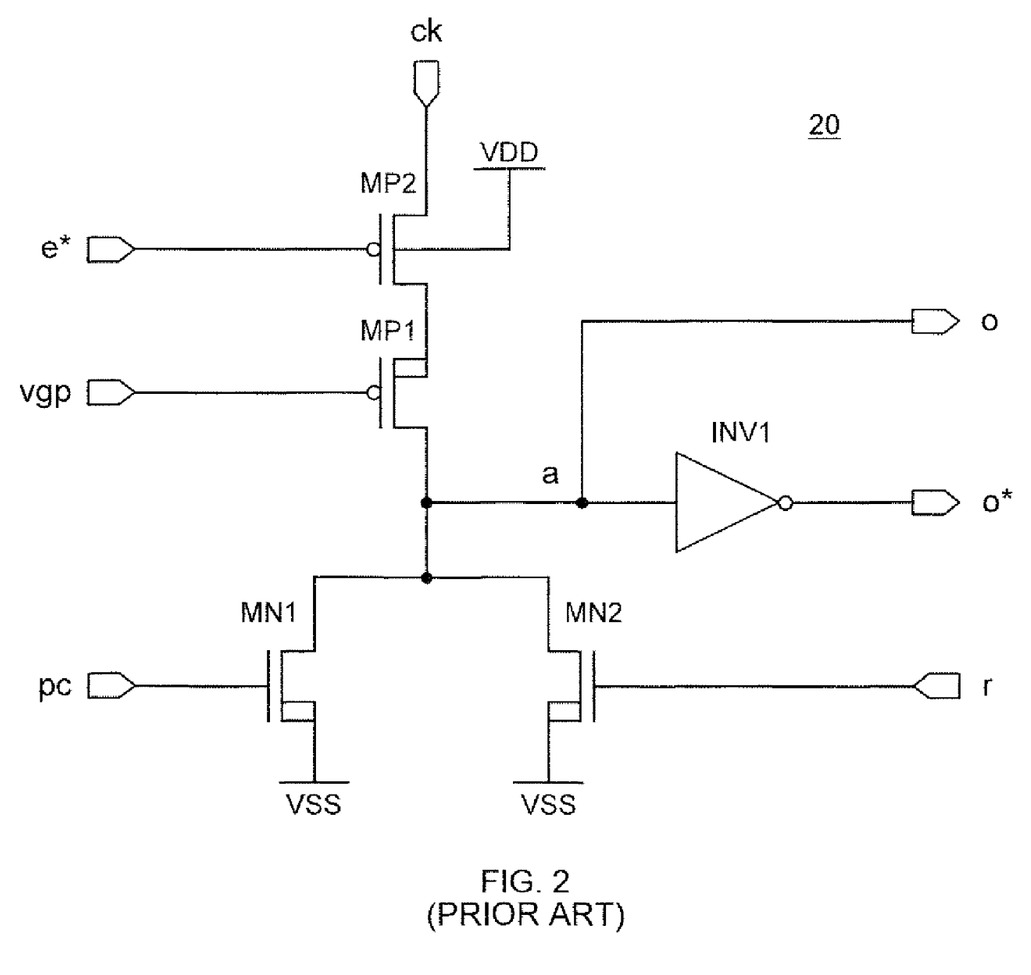
FIG. 2 illustrates another prior art shift register stage.

FIG. 2 illustrates another known shift register stage circuit 20 that improves to some extent on the design of FIG. 1. This shift register stage circuit is adapted to operate with a low voltage swing clock signal, but high voltage swing logic circuits. For example, the voltage range between VDD and VSS might be 10 volts to provide high speed. However, the voltage swing from the clock input ck might be much less that—on the order of three volts or so—to reduce power consumption.

The input and output signals for the circuit 20 of FIG. 2 are as follows:

ck clock signal with peak-to-peak voltage from VEE to VDD (VEE>VSS)
e* complementary output from previous shift register stage
o and o* register output and its complementary output, respectively
r reset signal for individual shifter register
vgp an analog bias voltage
pc a pre-charge signal to initialize all shifter registers to low before start The circuit 20 is configured such that an internal node a serves as both a collection point for input signal state and for driving output buffer INV1. Here, the number of state transistors has been reduced to only two, MP2 and MP1, arranged in cascode series. The ck signal input is fed to the source of MP2. The VDD supply voltage is fed to bias the body of transistor MP2. The gate of MP2 is fed by complimentary output from the previous shift register stage.

The gate of MP1 is controlled by vgp which is an analog bias voltage. MP1 is biased such that it conducts when its source voltage is greater than vgp by an amount, Vtp, where Vtp is the threshold voltage of MP1. A pre-charge input pc and a reset input r feed the drain of MP1 which also sets the voltage at node a.

In operation, the voltage vgp is thus set so that VEE-vgp<Vtp where Vtp is the threshold voltage of transistor MP1. When ck is low (VEE), MP1 is off and node a is held at its previous value; when ck is high (VDD) and the previous stage output e is high—which means that e* is low (VSS)—node a is charged up to a high voltage (VDD) through transistor MP1 and MP2.

The circuit 20 of FIG. 2 thus offers reduced power consumption as compared to the circuit 10 of FIG. 1. In designs such as this, however, with a high voltage swing shift register driven by a low voltage swing input clock, internal or external level shifters and clock buffers are thus often necessary.

SUMMARY OF THE INVENTION

The present invention is an improved design for a high voltage shift register which directly accepts low voltage clock signal inputs without using clock buffers. In particular, a shift register stage circuit is adapted to operate with a low voltage swing clock signal, with the stage circuit having a single state node, a, driven directly by a single input transistor. This arrangement allows for reduced power consumption.

The invention also provides improved speed. The speed of the shift register stage is mainly determined by parasitic capacitance connected to the single node a, and a small signal resistance from a clock signal input ck to node a. The parasitic capacitance includes wiring capacitance and capacitance of the transistors connected to node a.

A number of applications can take advantage of the resulting low power consumption and high speed. These include displays designed to use a shift register according to the new invention; portable devices that run on batteries such as video eyewear; electronic viewfinders for camcorder and digital cameras; military systems such as thermal weapon sights and night vision goggles; and other end uses.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 3:
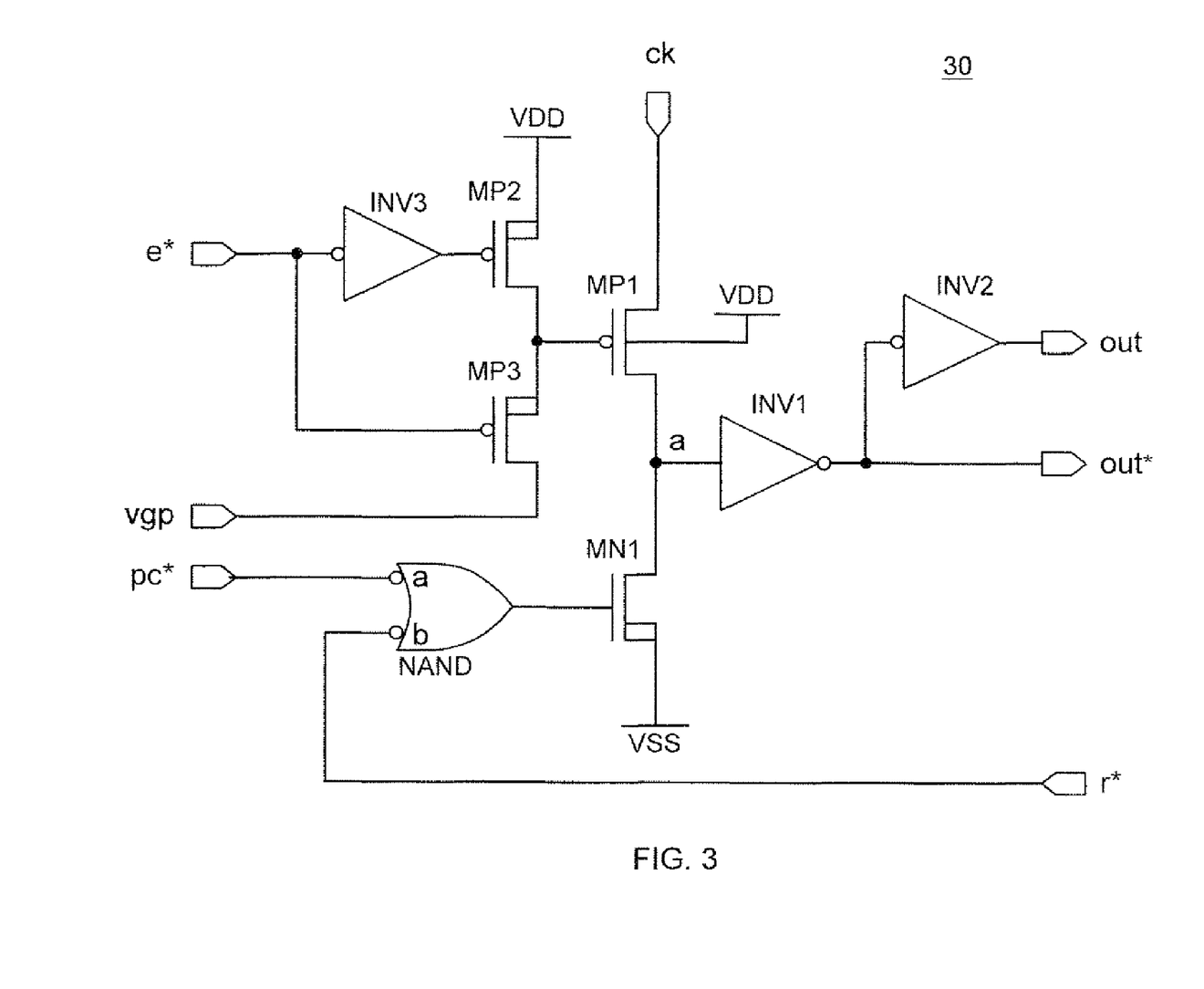
FIG. 3 illustrates one embodiment of the invention.

FIG. 3 illustrates a circuit 30 that improves over the arrangements of FIGS. 1 and 2. Here, the clock signal input ck also drives a stage transistor MP1. However, the gate of MP1 is fed from a pair of cascode transistors MP2 and MP3 that set the state at node a as determined by inputs e* and vgp. The inverted input from the previous stage e* is fed to the input terminal of inverter INV3 to control the gate of transistor MP3. The MP3 drain terminal controls the gate of transistor MP1. The source terminal of transistor MP2 is fed from voltage VDD.

An intended pre-charge input pc* is fed through the single NAND gate together with a reset signal r*. The output of the single NAND gate drives the gate terminal of signal buffer transistor MN1. The first inverter INV1 and second inverter INV2 provide, respectively, the inverted outputs out* and non-inverted output out.

Operation of circuit 20 is similar to that of circuit 20 of FIG. 2. However, the number of transistors connected to node a is reduced. In addition, through inverters INV1 and INV2, node a is shielded from external wiring and devices driven by shift register stage 30. The resistance from ck to node a is also reduced from that of a pair of cascode transistors to that of a single transistor.

Figure 4A:
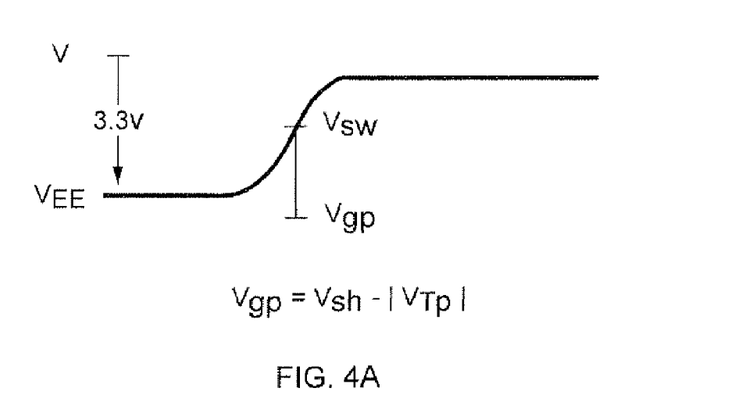
FIGS. 4A and 4B illustrate clock signals in more detail.

As for the circuit 20 of FIG. 2, vgp is set as VEE-vgp<Vtp, where Vtp is the threshold voltage of transistor MP1. The diagram of FIG. 4A can help visualize this situation, where Vsw is the switching threshold of transistor MP1 and Vtp is the p-channel threshold voltage of MP1.

Figure 4B:
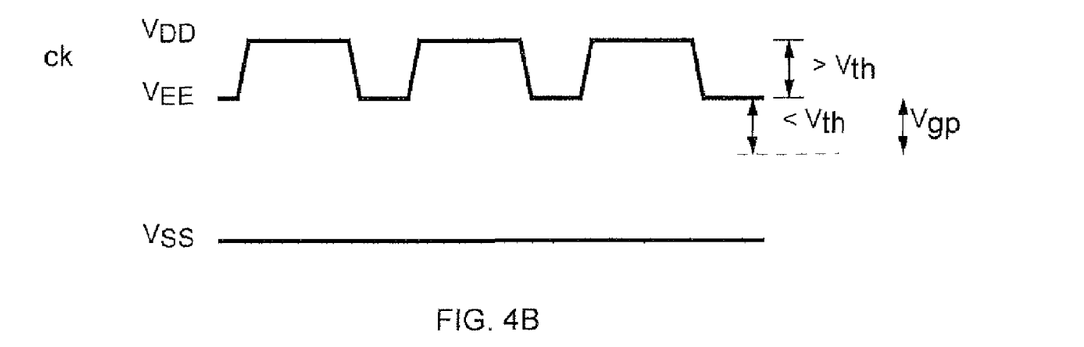

FIG. 4B illustrates, more particularly, the situation of low voltage clock signal ck where the signal value varies from a high rail voltage VDD only down to a voltage VEE that is much greater than the low rail voltage VSS. The swing between VEE and VDD may, for example, be only 3.3 volts with the threshold voltage $V_{th}$ set to slightly above VEE.

The speed of the shift register stage 30 of FIG. 3 is thus mainly determined by the parasitic capacitance connected to node a and the small signal resistance from the clock input ck to node a. This parasitic capacitance includes wiring capacitance and the capacitance of those transistors that are connected to node a.

Transistor MP1 is in turn biased such that it barely turns on when charging node a. Since this switching operation will already be relatively slow (i.e., it is controlled by a clock signal having a low voltage swing), one wants to avoid introducing extra resistance there.

The output load presented by output driver inverters INV1 and INV2 is furthermore now reduced since node a need only drive the single input to inverter INV1 and no external outputs directly. The inverters INV1 and INV2 thus also provide isolation from both outputs out and out*, providing circuit 30 with further isolation from the impedances that would be presented by external circuitry.

The inverters INV1 and INV2 may comprise fast 10 volt swing gates that are of less concern in terms of power consumption than the rest of internal shift register 20 circuitry driven by the low voltage swing clock signals. This arrangement also reduces the capacitive load on node a by having only the single connection.

The circuit 30 of FIG. 3 thus allows node a to swing from VDD to VSS being driven only by a low voltage swing clock signal ck (swinging from a much lower voltage range from 0-3 volts), while minimizing both resistance load and capacitance load. The circuit 30 of FIG. 3 thus provides advantages over the circuits 10 or 20 of FIG. 1 and/or FIG. 2 for the following reasons:

1. By combining the small r* and pc* inputs, only one transistor (MN1) is used to provide for pre-charging or resetting node a.

2. By combining inputs vgp and e* before applying them to the stage circuitry, only one other transistor, MP1, is needed to drive the node a. This arrangement reduces the resistance provided from the clock input to node a thus, the resistance times capacitance (RC) delay, is also lower.

3. By isolating both output signals out and out* with high voltage swing (10 volt) gates, increased speed is achieved.

Figure 5A:
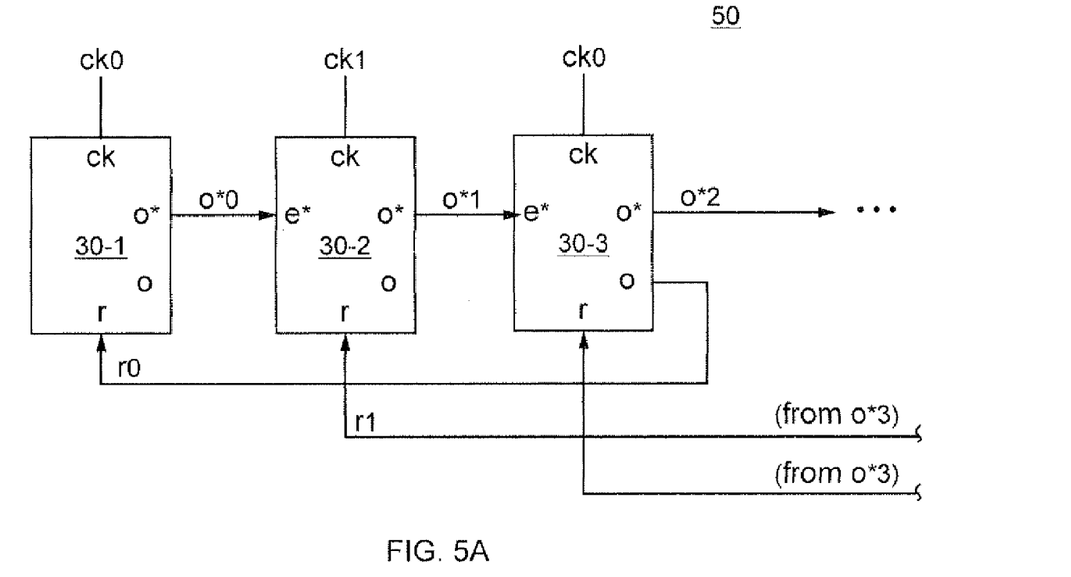
FIGS. 5A and 5B show how multiple stages of FIG. 3 are combined and a timing diagram.
Figure 5B:
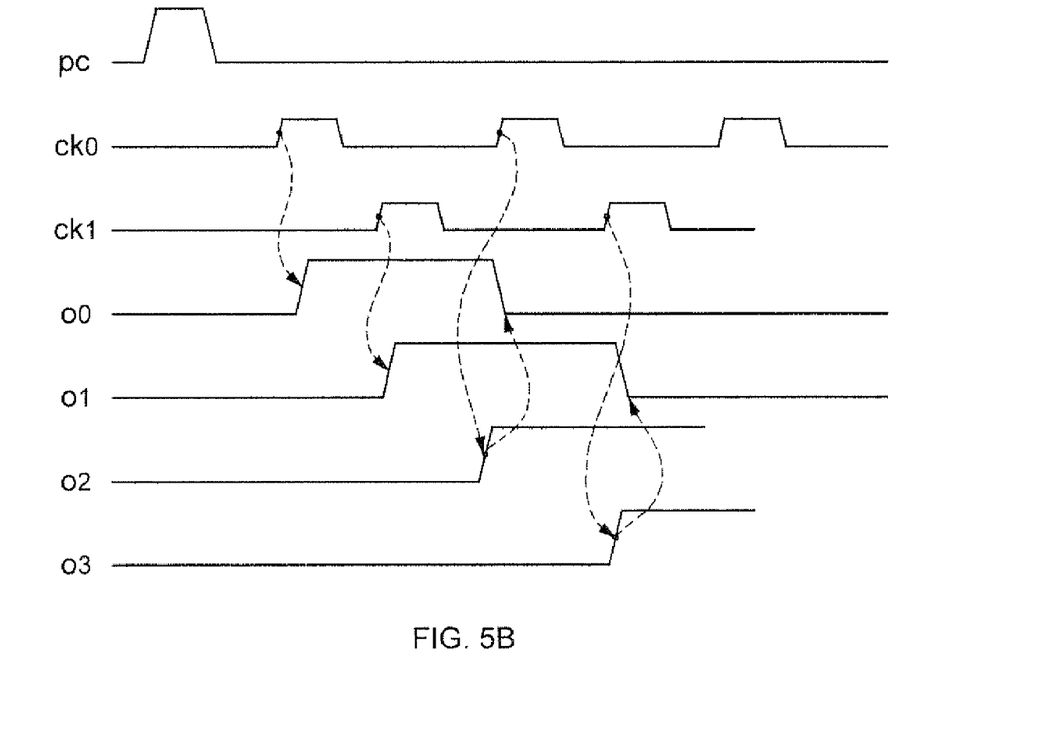

FIGS. 5A and 5B illustrate how multiple individual stages 30 of FIG. 3 may be combined to provide a pipelined shift register 50. Here, at least three individual stages 30 are required to feed a logic bit 1 from input to output. The series connected (pipelined) stages 30-1, 30-2, and 30-3 each have inverted output signals o* feeding the next successive inverted input signal e*. A pair of offset clock signals, ck0 and ck1, feed respective stages. The output of a given stage 30-3 feeds the reset input of the initial stage. This circuit thus provides a type of circulating shift register in which a bit value may be shifted from input to output.

The timing diagram of FIG. 5B illustrates that, for example, on the rising edge of the pre-charge pc signal all stages (o0, o1, o2, o3, etc.), are reset to a zero logic state. On the next rising edge of ck0, the output o0 (from the first stage 30-1) will switch to a high logic value state. On the next rising edge of clock signal ck1, a similar change occurs in the state of o1 (the output of second stage 30-2). On the next rising edge of clock signal ck0, output o2 will also then reach a high voltage state. The feedback connection from the output o2 of the third stage (30-3) back to the first stage 30-1 will then cause the output state o0 of the first stage 30-1 to return to a low logic value.

The feedback signal from the output o3 of a stage 30-4 (not shown) similarly controls second stage 30-2, and so on, in a string of such stages depending on the desired length of the shift register.

Figure 6:
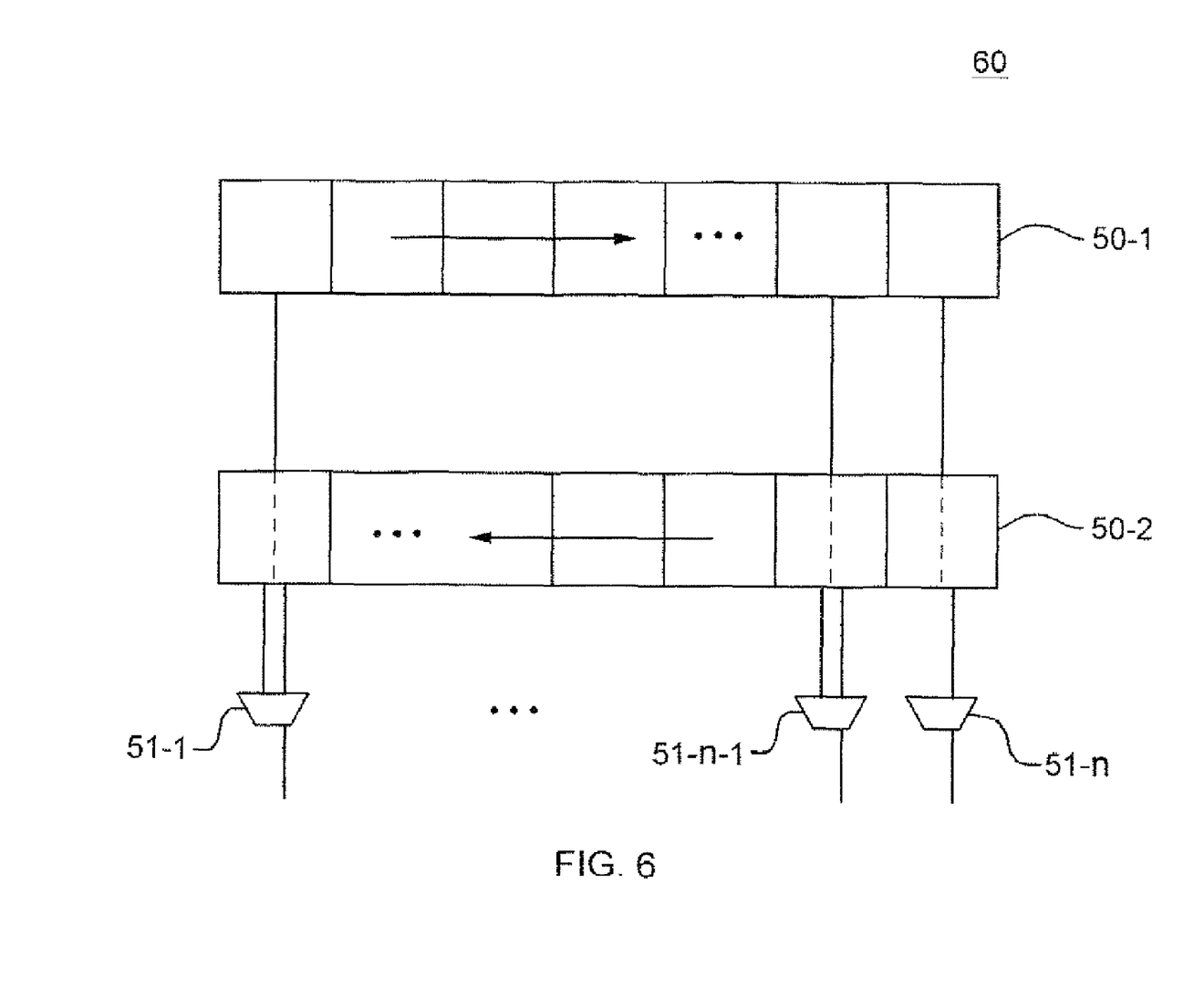
FIG. 6 is a high level diagram illustrating a bidirectional shift register.

FIG. 6 is a high level diagram illustrating how a pipelined shift register 50 such as shown in FIG. 5A may be arranged to provide a bidirectional shift register 60. One such pipeline 50-1 is arranged to shift from left to right, and a second pipeline 50-2 to shift to right to left. Multiplexers 51-1, . . . 51-n-1, 51-n connected to each output bit permit selection of the direction to be used.

Shift registers according to the present invention may be used in many different applications. As but one example, displays of the type described in co-pending U.S. application Ser. No. 11/784,215 filed Apr. 5, 2007, hereby incorporated by reference, include an array of pixel elements. As is known in the art, those pixel elements are controlled by row select lines and column select lines. These select lines may be fed from respective shift registers 50 that are implemented as described herein. Displays of that type may in turn be used in digital cameras, digital Single Lens Reflex (SLR) cameras, night vision displays, handheld video games, mobile telephones, video eyewear devices, and other similar products.

While this invention has been particularly shown and described with references to example embodiments thereof, it will be understood by those skilled in the art that various changes in form and details may be made therein without departing from the scope of the invention encompassed by the appended claims.

What is claimed is:

1. A shift register stage circuit comprising:
a single stage transistor, MP1, connected to receive a clock signal, ck, at a source terminal, connected to receive a state input signal at a gate terminal, and to provide a stage output node signal at a drain terminal, the clock signal being a low voltage clock signal having a voltage range between a high voltage supply reference, VDD, and a low clock voltage, VEE, with VEE being greater than a low supply reference voltage, VSS;
an input circuit, comprising at least one input transistor, having a gate terminal connected to receive a stage input signal, one of a drain or source terminal connected to the high voltage supply reference, and one of another source or drain terminal connected to a bias voltage, Vgp, with voltage Vgp depending up a threshold voltage of the input transistor, Vth, and the low clock voltage, VEE, and the input circuit connected to provide the state input signal to the gate terminal of the single stage transistor; and
a single buffer transistor, MN1, connected to receive the low supply voltage, VSS, at a drain terminal, connected to the stage output node at a source terminal, and connected to receive a precharge signal at a gate terminal.

2. The apparatus of claim 1 wherein the input circuit comprises:
a pair of input transistors, MP2 and MP3, connected as a cascode series pair, such that a drain terminal of MP2 is connected to a source terminal of MP3 at a cascode pair node, and with gate terminals of MP2 and MP3 connected to receive complimentary stage input signals, and with a source terminal of MP2 connected to the high voltage supply reference, VDD, and with a drain terminal of MP3 connected to the bias voltage reference, Vgp, and to provide the state input signal to the single stage transistor at the cascode pair node.

3. The apparatus of claim 1 wherein the low clock voltage, VEE is above 0 volts and below 3.3 volts.

4. The apparatus of claim 2 wherein the complimentary stage input signals are received from another shift register stage circuit.

5. The apparatus of claim 1 wherein the single stage transistor, MP1, is a P-channel field effect transistor and the single buffer transistor, MN1 is an N-channel field effect transistor.

6. The apparatus of claim 1 additionally comprising:
a logic gate, connected to receive the precharge signal at a first input terminal, to receive a stage reset signal at a second input terminal, and to provide a node control signal at an output terminal coupled to the gate terminal of the single buffer transistor MN1.

7. The apparatus of claim 6 wherein the logic gate is a NAND gate.

8. The apparatus of claim 6 additionally comprising:
a least one output buffer inverter, INV1, connected to receive the state input signal.

9. A multiple stage, pipeline shift register circuit comprising:
at least three shift register stages, with each stage comprising:
a single stage transistor, MP1, connected to receive a clock signal, ck, at a source terminal, connected to receive a state input signal at a gate terminal, and to provide a stage output node signal at a drain terminal, the clock signal being a low voltage clock signal having a voltage range between a high voltage supply reference, VDD, and a low clock voltage, VEE, with VEE being greater than a low supply reference voltage, VSS;
a single buffer transistor, MN1, connected to receive the low supply reference voltage, VSS, at a drain terminal, connected to the corresponding stage output node signal at a source terminal, and connected to receive a precharge input at a gate terminal;
an input circuit, comprising at least one input transistor, having a gate terminal connected to receive a stage input node signal, one of a drain or source terminal connected to the high voltage supply reference, and one of another source or drain terminal connected to a bias voltage, Vgp, with voltage Vgp depending up a threshold voltage of the input transistor, Vth, and the low clock voltage, VEE, and the input circuit connected to provide the state input signal to the gate terminal of the single stage transistor; and
a logic gate, connected to receive a precharge signal at a first input terminal, to receive a stage reset signal at a second input terminal, and to provide a node control signal at an output terminal coupled to the gate terminal of the single buffer transistor MN1; and
with the at least three shift register stages further connected such that the stage output node signal stage of a first shift register stage is connected to a stage input node signal of a second shift register stage, the stage output node signal of the second shift register stage is connected to a stage input node signal of a third shift register stage, and the stage output node signal of the third shift register stage is connected to provide the precharge signal to the first shift register stage.

10. The apparatus of claim 9 wherein the multiple stage, pipeline shift register circuit is coupled to a display element.

11. The apparatus of claim 10 wherein the display element is used in one of a digital camera, digital Single Lens Reflex (SLR) camera, night vision display, handheld video game, mobile telephone, or video eyewear device.

12. The apparatus of claim 10 wherein at least one of a display row select line or a display column select line is provided from the multiple stage, pipeline shift register circuit.

* * * * *

UNITED STATES PATENT AND TRADEMARK OFFICE
CERTIFICATE OF CORRECTION

| | |
|---|---|
| PATENT NO. | : 7,672,420 B2 |
| APPLICATION NO. | : 12/420476 |
| DATED | : March 2, 2010 |
| INVENTOR(S) | : Frederick P. Herrmann and Kun Zhang |

It is certified that error appears in the above-identified patent and that said Letters Patent is hereby corrected as shown below:

Col. 5; Claim 8, line 55, delete "state input" and insert --stage output node--.

Signed and Sealed this

Twenty-fifth Day of May, 2010

David J. Kappos
*Director of the United States Patent and Trademark Office*